(12) United States Patent
Kawao et al.

(10) Patent No.: US 8,689,429 B2
(45) Date of Patent: Apr. 8, 2014

(54) METHOD OF REWORKING HEAD SUSPENSION

(75) Inventors: Sei Kawao, Aikoh-gun (JP); Takeshi Shimoda, Aikoh-gun (JP); Shinpei Kakiuchi, Aikoh-gun (JP)

(73) Assignee: NHK Spring Co., Ltd., Kanagawa (JP)

( * ) Notice: Subject to any disclaimer, the term of this patent is extended or adjusted under 35 U.S.C. 154(b) by 700 days.

(21) Appl. No.: 12/843,312

(22) Filed: Jul. 26, 2010

(65) Prior Publication Data

US 2011/0016685 A1    Jan. 27, 2011

(30) Foreign Application Priority Data

Jul. 27, 2009  (JP) ................. P2009-174170

(51) Int. Cl.
*G11B 5/48*    (2006.01)
(52) U.S. Cl.
USPC ........... 29/603.02; 29/840; 29/762; 29/426.5; 228/160; 228/191; 360/294.3; 360/244.5
(58) Field of Classification Search
USPC ............... 29/603.02, 603.04, 840, 843, 762, 29/426.5; 228/160, 191; 360/294.3, 244.5, 360/244.7
See application file for complete search history.

(56) References Cited

U.S. PATENT DOCUMENTS

| | | | |
|---|---|---|---|
| 6,064,550 A * | 5/2000 | Koganezawa | 360/294.3 |
| 6,829,818 B2 * | 12/2004 | Kamigama et al. | 29/603.04 X |
| 7,013,554 B2 * | 3/2006 | Wong et al. | 29/603.02 |

FOREIGN PATENT DOCUMENTS

| | | |
|---|---|---|
| JP | 57-106263 | 12/1980 |
| JP | 57-127371 | 1/1981 |
| JP | 61-201676 | 9/1986 |
| JP | 63-63771 | 3/1988 |
| JP | 5-345290 | 12/1993 |
| JP | 08018211 A * | 1/1996 |
| JP | 2002-237694 | 8/2002 |
| JP | 2005-166760 | 6/2005 |
| JP | 2008-210491 | 9/2008 |

* cited by examiner

Primary Examiner — A. Dexter Tugbang
(74) Attorney, Agent, or Firm — Jordan and Hamburg LLP

(57) ABSTRACT

A method of reworking a head suspension removes a slider from the head suspension by pressing a blade from a first side toward a second side in a longitudinal direction of the slider to solder ball bonding, stopping the second side of the slider in the longitudinal direction with a holding mechanism, and forcing the blade to bite and cut the solder ball bonding to remove the slider from the flexure. The solder ball bonding is cut without applying extra force to components of the head suspension except the slider. The method improves product yield.

9 Claims, 10 Drawing Sheets

Fig. 8A Set head suspension on cutting jig
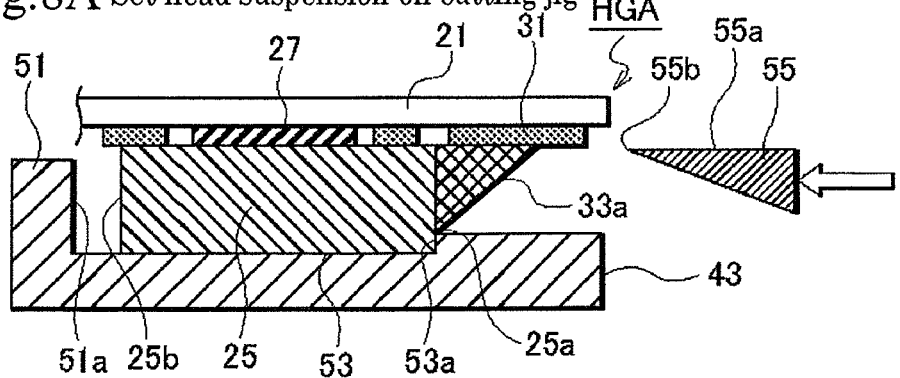
Fig. 8B Bite solder ball bonding with blade
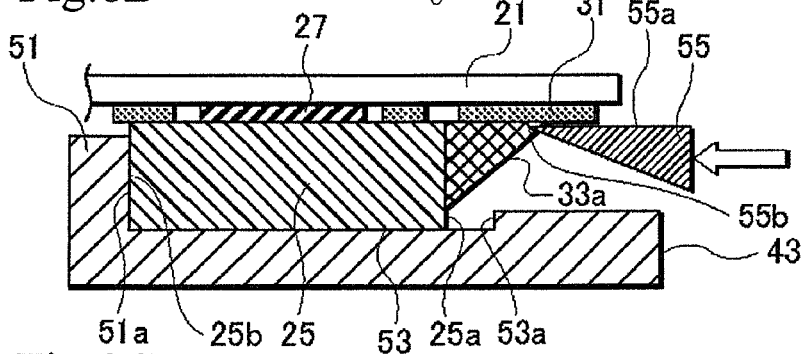
Fig. 8C Cut solder ball bonding with blade
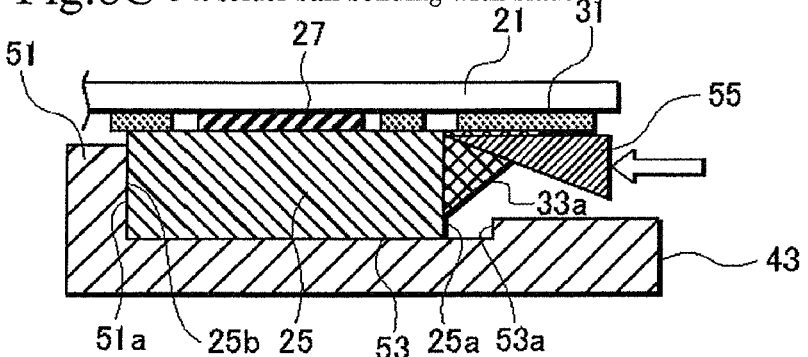
Fig. 8D Retract blade to initial position
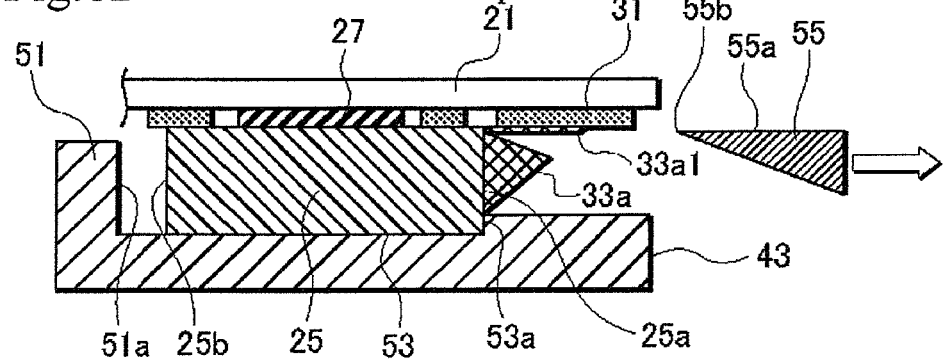

Fig.9A Set head suspension 19 on jig
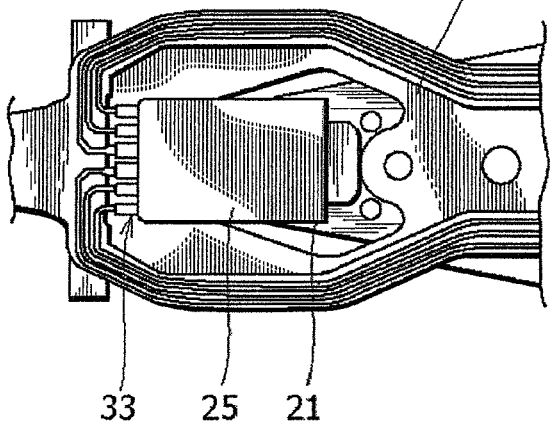
33  25  21
Fig.9B Apply heating tool to slider
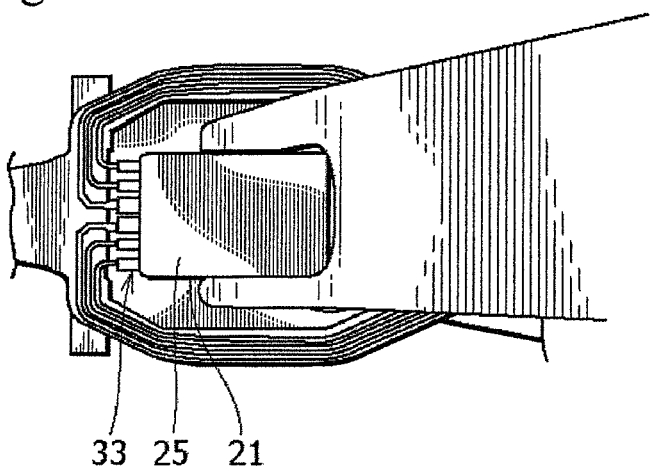
33 25 21
Fig.9C Partial view of heating tool
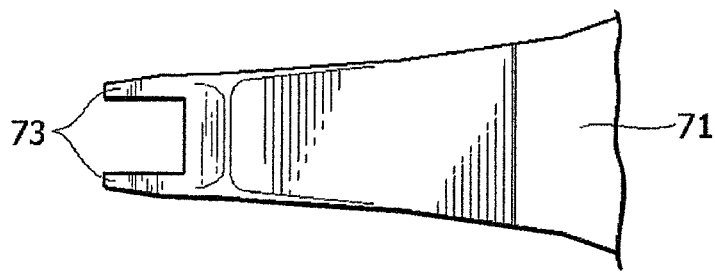
73   71

Fig.10A Twist slider with heating tool
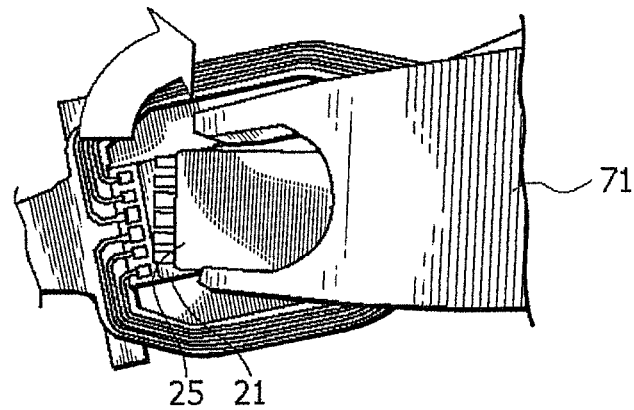
Fig.10B Release slider
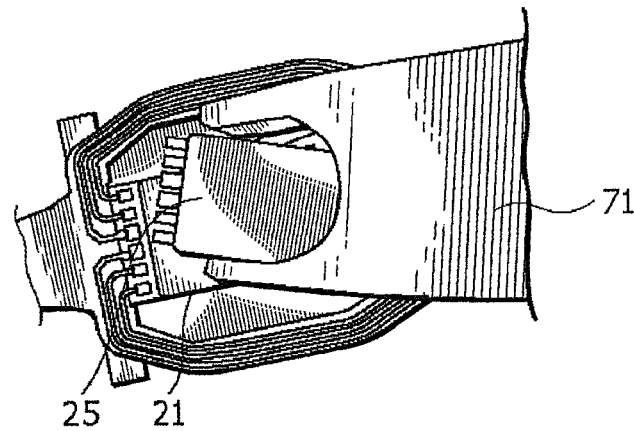
Fig.10C Completion of slider release
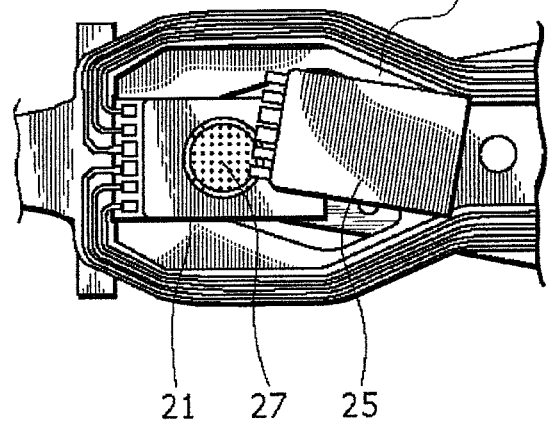

METHOD OF REWORKING HEAD SUSPENSION

BACKGROUND OF THE INVENTION

1. Field of the Invention

The present invention relates a method of reworking a head suspension for supporting a magnetic head in a disk drive installed in an information processing apparatus such as a personal computer and a cutting jig used for the rework.

2. Description of Related Art

A head suspension supports a magnetic head to write and read data to and from a magnetic disk in a disk drive. The head suspension includes a slider on which the magnetic head is arranged and a flexure having a tongue to hold the slider. The head suspension provided with the slider is sometimes called a head gimbal assembly (HGA).

Head suspensions are tested for their characteristics such as electrical characteristics after manufacturing and only those that pass the test are shipped. Any head suspension that has failed the test due to a problem on the slider thereof is reworked by removing the slider and replacing the same with a new one.

An example of such rework is disclosed in Japanese Unexamined Patent Application Publication No. 2008-210491. This related art will be explained with reference to FIGS. 1A and 1B that are side views illustrating a slider 2 to be removed from a tongue 3 of a flexure of a head suspension.

In FIG. 1A, heated tweezers 1 are used to hold rear side faces of the slider 2. Force is applied to the tweezers 1 in a direction to remove the slider 2 from the tongue 3, and at the same time, the slider 2 is heated for about four seconds. The position to hold the slider 2 with the tweezers 1 is on the rear side of a longitudinal center of the slider 2, so that heat is conducted to an adhesive 4 between the slider 2 and the tongue 3 and not to a solder fillet 5 or an electrode pad 6.

Due to the heat and tensile force applied to the adhesive 4 on the slider 2, the adhesive 4 whose melting point is lower than that of the solder fillet 5 melts and the slider 2 is removed from the tongue 3. At this time, a joint 8 between the solder fillet 5 and an electric terminal 7 is broken and the slider 2 is detached from the head suspension.

According to this related art, force is applied in the direction to remove the slider 2 from the tongue 3, and therefore, stress is applied to the tongue 3 and the periphery thereof to deform them. The slider removing force also acts on the flexure to occur a deformation mode to separate the tongue 3 from a dimple formed on the flexure. If the tongue 3 and the periphery thereof are deformed or if the tongue 3 and dimple are separated from each other, the head suspension becomes unworthy of rework.

In this way, the related art has the problems of damaging (deformation, separation, and the like) a head suspension to make it not-reusable and deteriorating product yields.

SUMMARY OF THE INVENTION

An object of the present invention is to provide a method of reworking a head suspension and a cutting jig used to rework a head suspension, capable of reworking the head suspension without damaging the same, thereby improving product yields.

In order to accomplish the object, an aspect of the present invention provides a method of reworking a head suspension that includes a magnetic head, a slider on which the magnetic head is arranged having a first side and a second side in a longitudinal direction thereof, a flexure having a tongue resiliently supporting the slider, wiring formed on the flexure, and a terminal joint where an electric terminal of the slider and an electric terminal of the wiring are joined together with a bonding material. The method includes pressing a blade to the bonding material from the first side toward the second side in the longitudinal direction of the slider, stopping the second side of the slider in the longitudinal direction with a holding mechanism, thereby forcing the blade to bite and cut the bonding material to remove the slider from the flexure.

According to this aspect of the present invention, components of the head suspension other than the slider receive no extra force when the terminal joint is separated by cutting the bonding material. Namely, the components of the head suspension except the slider are put in a stress-free state when the bonding material of the terminal joint is cut.

This aspect, therefore, prevents the head suspension to be reworked from deforming and improves product yield.

The method of this aspect is easily carried out by a cutting jig having a cutting mechanism configured to press a blade to the bonding material from the first side toward the second side in the longitudinal direction of the slider, and a holding mechanism stopping the second side of the slider in the longitudinal direction when the blade is pressed to the bonding material.

BRIEF DESCRIPTION OF THE DRAWINGS

FIGS. 5A and 5B illustrate a cutting jig for rework according to an embodiment of the present invention, in which FIG. 5A is a plan view and FIG. 5B is a side view;

FIGS. 8A to 8D illustrate a cutting step of the method of FIG. 7 carried out with the jig of FIGS. 5A and 5B; and FIGS. 9A to 9C and 10A to 10C illustrate a removing step of the method of FIG. 7 carried out with a heating tool.

DETAILED DESCRIPTION OF EMBODIMENTS

A method of reworking a head suspension and a cutting jig for rework according to embodiments of the present invention will be explained in detail with reference to the drawings.

The head suspension reworking method according to an embodiment of the present invention is characterized by pressing a blade to a bonding material from a first side toward a second side in a longitudinal direction of a slider, stopping the second side of the slider in the longitudinal direction with a holding mechanism, thereby forcing the blade to bite and cut the bonding material, and removing the slider from a flexure of a head suspension.

Figure 1A:
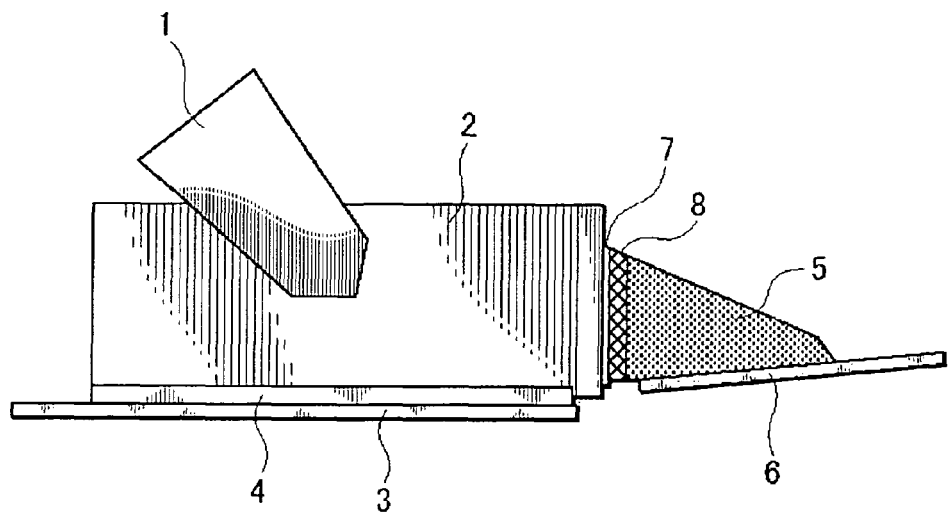
FIGS. 1A and 1B are views explaining an example of the reworking of a head suspension according to a related art.
Figure 1B:
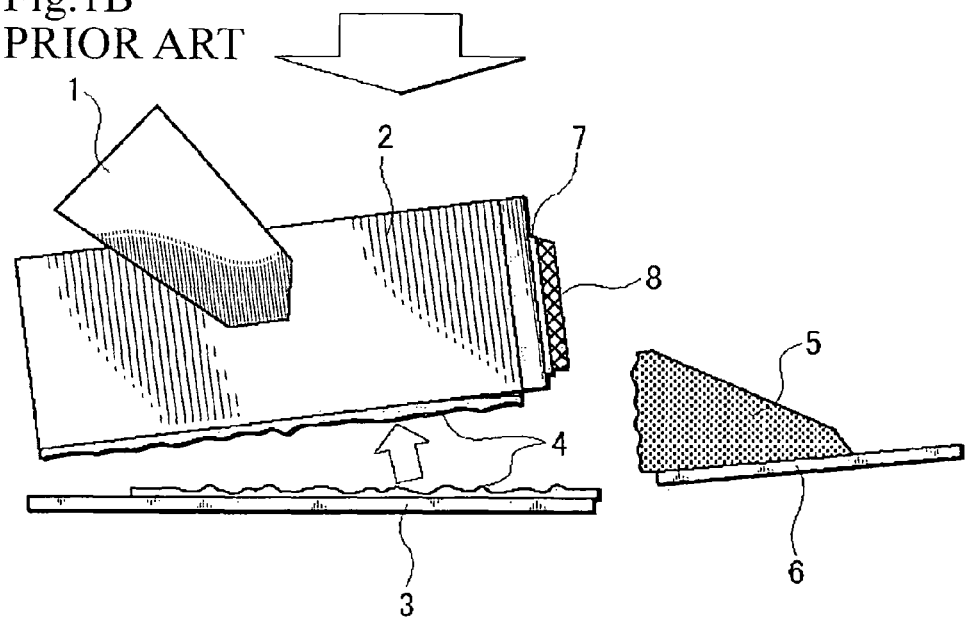
Figure 2:
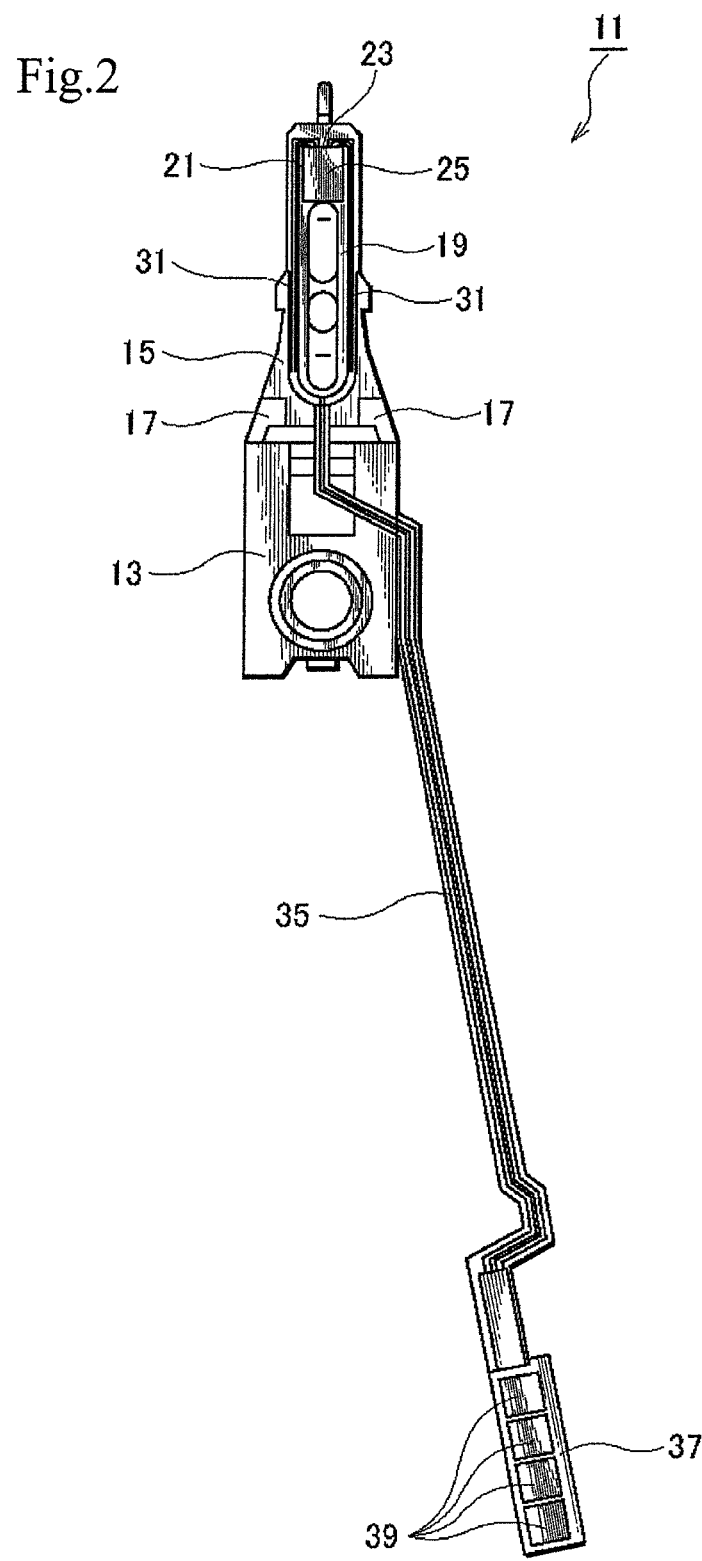
FIG. 2 is a plan view illustrating an example of a head suspension to be reworked.
Figure 3:
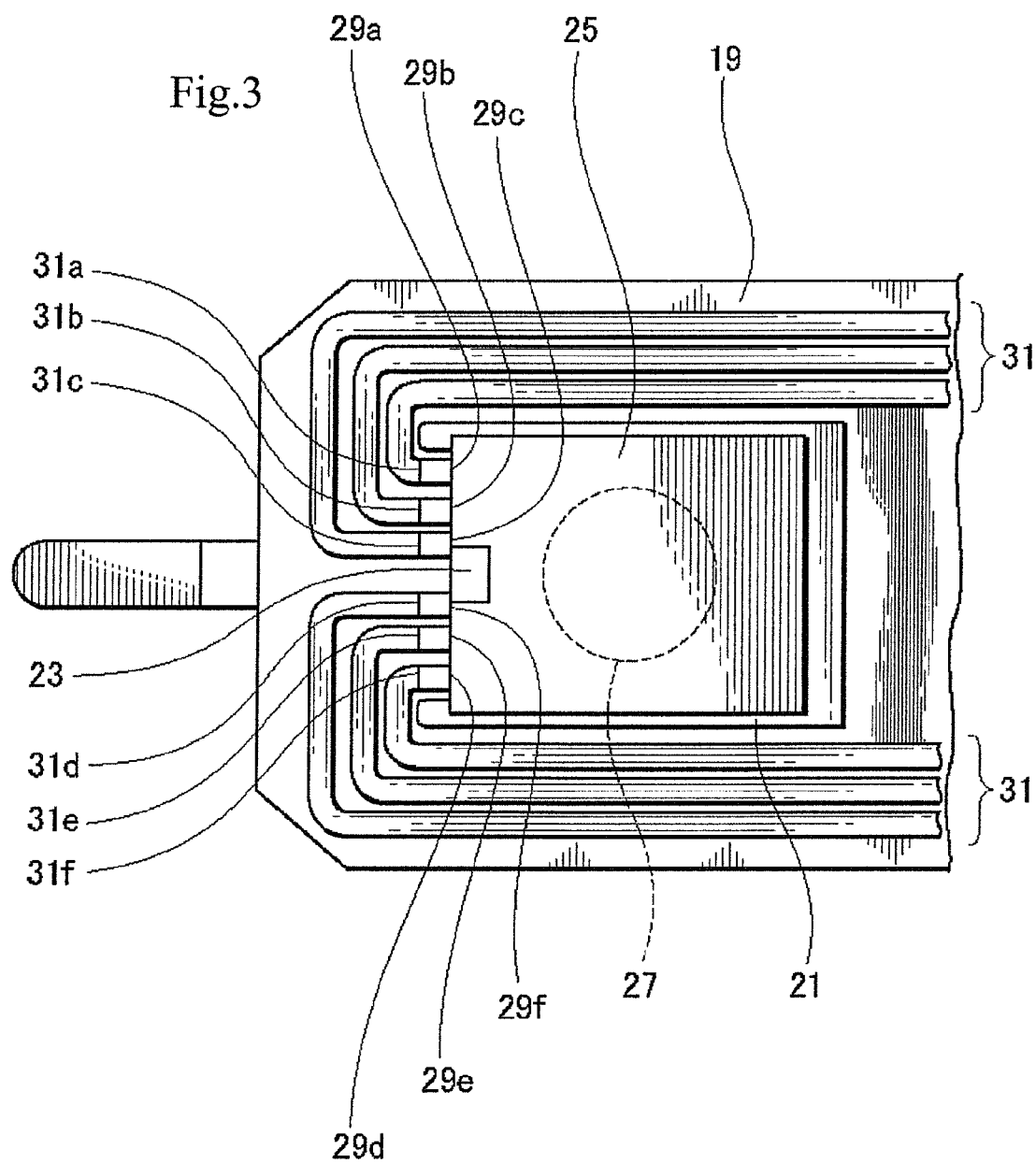
FIG. 3 is an enlarged plan view illustrating an area around a tongue of the head suspension of FIG. 2.
Figure 4:
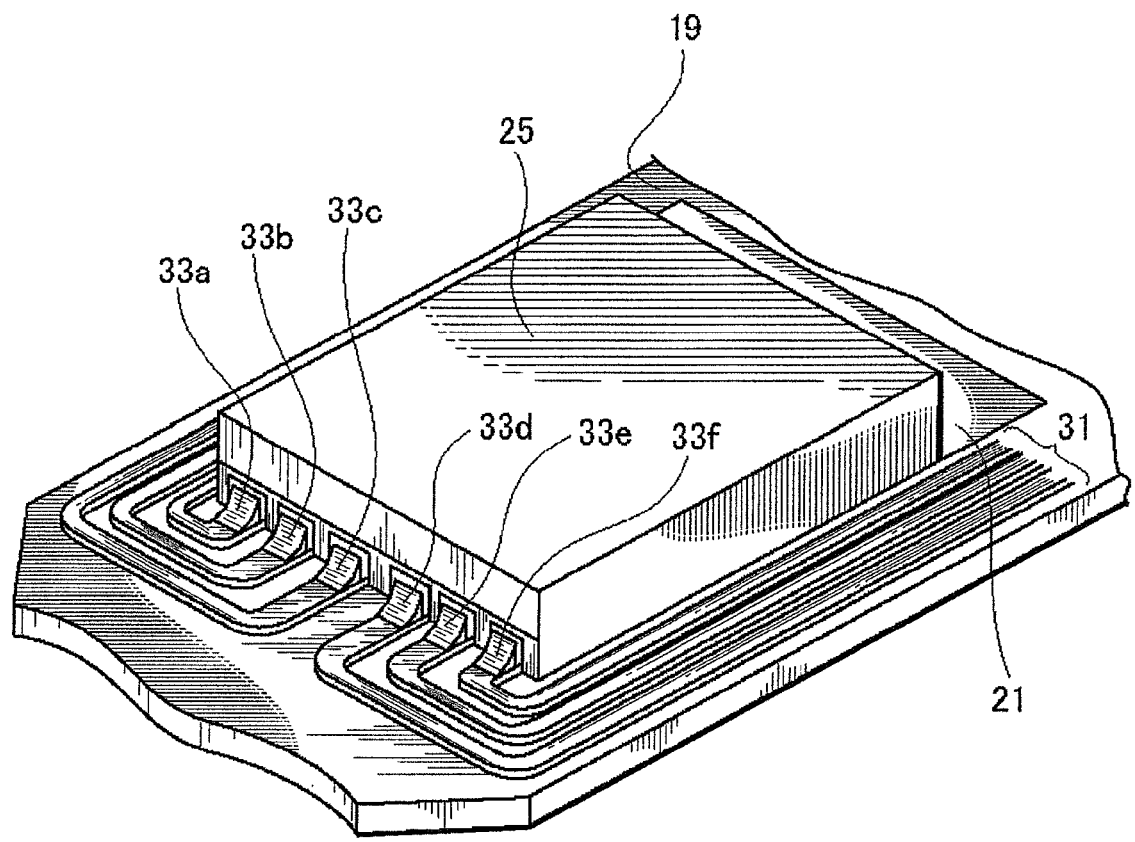
FIG. 4 is an enlarged perspective view illustrating the area illustrated in FIG. 3.

First, an example of a head suspension to be reworked according to the present invention will be explained with reference to FIGS. 2 to 4 in which FIG. 2 is a plan view generally illustrating the head suspension 11, FIG. 3 is an enlarged plan view illustrating an area around a tongue 21 of the head suspension, and FIG. 4 is a perspective view illustrating the area of FIG. 3.

As illustrated in FIG. 2, the head suspension 11 includes a base plate 13, a load beam 15, and a flexure 19.

The base plate 13 resiliently supports the load beam 15 and is made of, for example, a stainless steel thin plate having a thickness of about 150 to 200 μm.

The load beam 15 applies load onto a slider 25 and is made of, for example, a stainless steel thin plate having a thickness of about 30 to 150 μm. The load beam 15 is joined through a pair of bends 17 to the base plate 13 by, for example, spot welding.

The flexure 19 is made of a precision metal thin plate that is thinner than the load beam 15. The flexure 19 resiliently supports the slider 25 and is joined with a front end of the load beam 15 by, for example, spot welding.

A front end of the flexure 19 is provided with the tongue 21 on which the slider 25 is fixed with an adhesive 27 (indicated with a dotted circle in FIG. 3). On the slider 25, a write/read magnetic head 23 is arranged. The head suspension 11 provided with the slider 25 is sometimes called "head gimbal assembly (HGA)".

As illustrated in FIGS. 3 and 4, the slider 25 has a first side and a second side opposite to the first side in a longitudinal direction thereof. A front end in the first side of the slider 25 is provided with six electric terminals 29a to 29f. These terminals are arranged side by side to transfer write/read signals to and from the magnetic head 23.

On the surface of the flexure 19, wiring 31 is arranged to transmit the write/read signals to and from the magnetic head 23. A front end of the wiring 31 is provided with six electric terminals 31a to 31f. These terminals are arranged side by side to face the electric terminals 29a to 29f of the slider 25, respectively, so as to transfer the write/read signals to and from the magnetic head 23.

The electric terminals 29a to 29f of the slider 25 and the electric terminals 31a to 31f of the wiring 31 are electrically connected to each other with solder ball bonding parts 33a to 33f, respectively. The solder ball bonding parts 33a to 33f are collectively referred to as "solder ball bonding 33" and serve as both of the bonding material and the terminal joint. The solder ball bonding parts 33a to 33f are preferably made of lead-free solder from the standpoint of natural environment preservation.

As illustrated in FIGS. 2 and 3, the wiring 31 starts from the electric terminals 31a to 31f and extends on each side of the slider 25 to interpose the slider 25 therebetween and along each edge of the flexure 19 toward a rear end of the flexure 19.

From the rear end of the flexure 19, the wiring 31 forms a wiring tail 35 that reaches connection terminals 39 arranged on a base 37 of the flexure 19. The connection terminals 39 are connected to a data processing circuit (not illustrated) of a magnetic disk drive (not illustrated) in which the head suspension 11 is installed.

The write/read magnetic head 23 is a magnetoelectric element to convert a magnetic signal into an electric signal, such as an MR element, a GMR element, and a TuMR element.

Data read by the magnetoelectric element out of a magnetic disk is converted by the head 23 into an electric signal and is transmitted through the wiring 31 to the data processing circuit of the magnetic disk drive. Data to be written is sent as an electric signal from the data processing circuit to the head 23 through the wiring 31, is converted by the magnetoelectric element into a magnetic signal, and is written to the magnetic disk.

The adhesive 27 to fix the slider 25 to the tongue 21 is mainly made of resin that forms a network structure when heated, such as epoxy-based resin, phenol-based resin, and urethane-based resin.

The head suspension 11 illustrated in FIGS. 2 to 4 is only an example of a head suspension to be reworked according to the present invention. The present invention is applicable to other head suspensions having at least a solder ball bonding 33 as a bonding material joining the electric terminal of the slider 25 and the electric terminal of the wiring 31 together.

Figure 5:
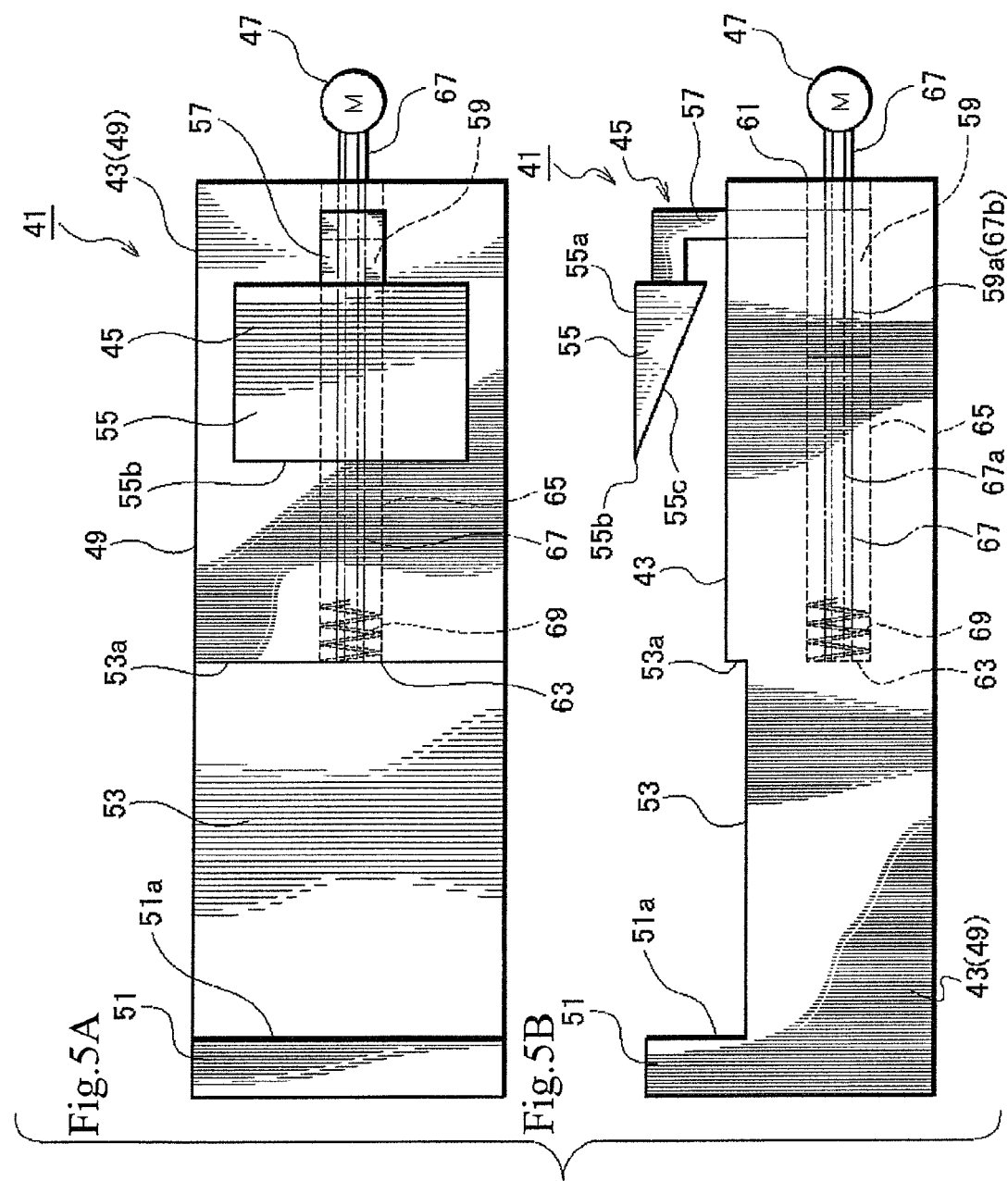
Figure 6:
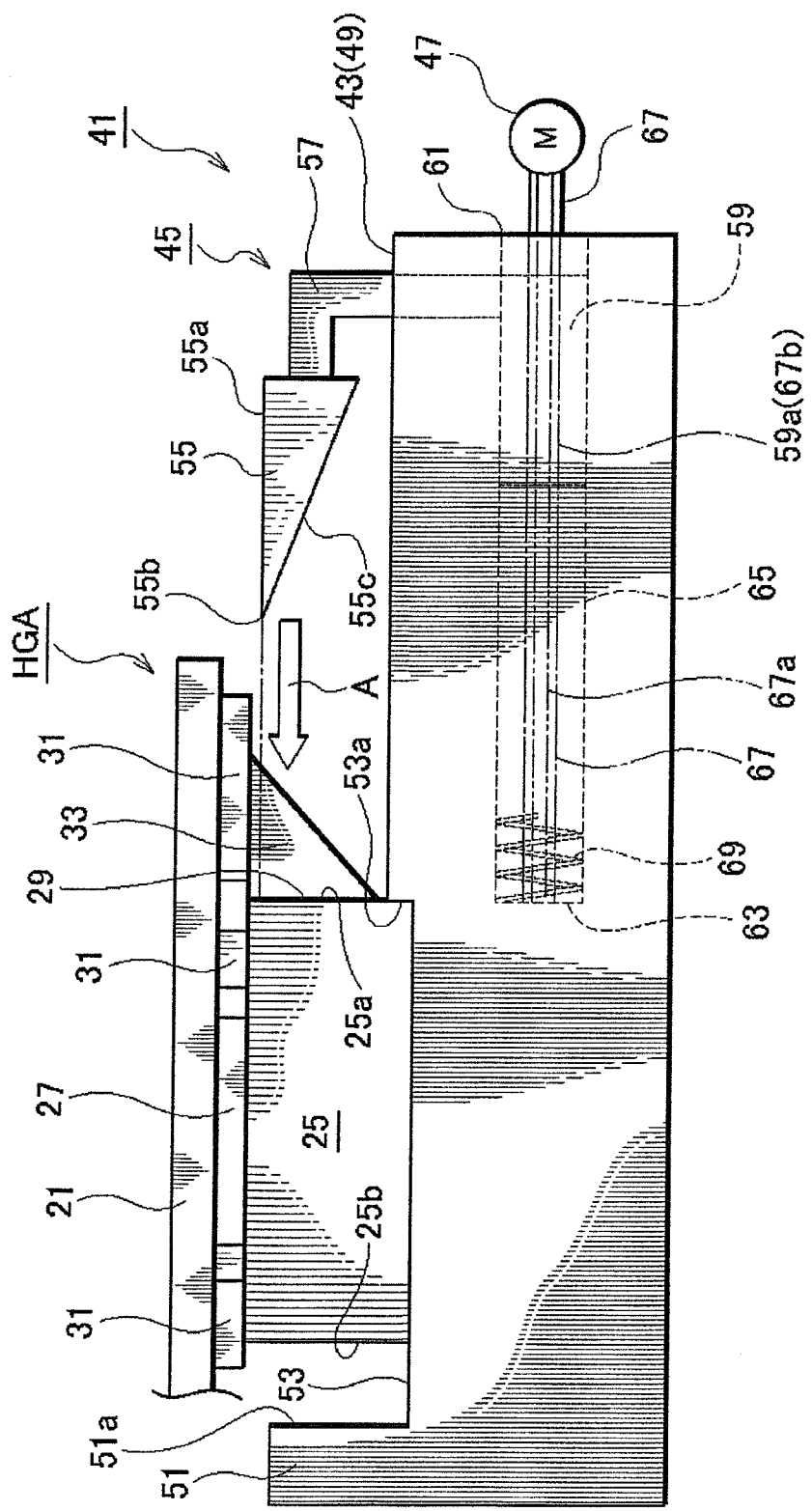
FIG. 6 illustrates operation of the jig of FIGS. 5A and 5B.

Next, a cutting jig for rework according to an embodiment of the present invention will be explained. The jig is used to remove a slider from a head suspension or a head gimbal assembly. FIG. 5A is a plan view illustrating the cutting jig for rework, FIG. 5B is a side view illustrating the same, and FIG. 6 is a side view illustrating operation of the same. In FIGS. 5A to 6, a moving mechanism of the jig is illustrated with an imaginary line.

As illustrated in FIGS. 5A, 5B and 6, the cutting jig 41 for rework includes a base 43, a blade carrier 45 movable in a longitudinal direction of the base 43, and a driver 47 to drive the blade carrier 45. According to the embodiment, the driver 47 is a motor.

The base 43 is made of steel and includes a body 49 having a rectangular plate-like shape. The body 49 has an upright end 51 that is integral with a side of the body 49. The body 49 also has a guide groove 53 to guide the slider 25 of the head suspension 11 in the longitudinal direction of the base 43.

The upright end 51 has a stop face 51a to stop the slider 25. The guide groove 53 has a step 53a to restrict the range of movement of the slider 25. The stop face 51a and step 53a define the moving range of the slider 25 so that the slider 25 may move forward and backward in the longitudinal direction within the moving range.

The blade carrier 45 includes a wide blade 55, a support leg 57, and a moving leg 59.

The blade 55 is wider than the slider 25 and is supported in such a way that a rectangular top face 55a of the blade 55 is kept horizontal. The blade 55 has a rectangular flank 55c that is continuous to a cutting edge 55b and forms a predetermined flank angle with respect to the top face 55a serving as a horizontal reference. The blade 55 simultaneously cuts the solder ball bonding parts 33a to 33f serves as both of the bonding material and terminal joint.

The support leg 57 is made of a rectangular steel material and horizontally supports the blade 55 from below.

The moving leg 59 is made of a rectangular steel material and supports and moves, through the support leg 57, the blade 55.

To movably support the blade carrier 45, an open groove 65 is formed at a widthwise central part of the body 49. The open groove 65 extends in the longitudinal direction of the body 49 from a base end 61 that is opposite to the upright end 51 to an intermediate part 63 in the vicinity of the step 53a of the guide groove 53.

An internal dimension of the open groove 65 is slightly larger than an outer dimension of the moving leg 59, so that the moving leg 59 is slidable or movable along the open groove 65 while maintaining the attitude of the moving leg 59.

The open groove 65 supports a threaded shaft 67a of a ball screw 67 that extends in the longitudinal direction of the body 49 from the base end 61 to the intermediate part 63. The threaded shaft 67a is rotatable forwardly and reversely.

The threaded shaft 67a of the ball screw 67 engages with a nut 67b that is integral with an inner circumferential face of a through hole 59a of the moving leg 59.

The driver 47 turns the threaded shaft 67a of the ball screw 67 forwardly and reversely. According to the direction and quantity of the turn, the blade carrier 45 is moved in the longitudinal direction of the body 49 without changing the attitude of the blade carrier 45.

At the intermediate part 63, there is arranged a resilient member 69 such as a spring.

The base 43, body 49, upright end 51, stop face 51a, guide groove 53, and step 53a serve as the holding mechanism.

The blade carrier 45, blade 55, open groove 65, and ball screw 67 serve as the cutting mechanism.

Figure 7:
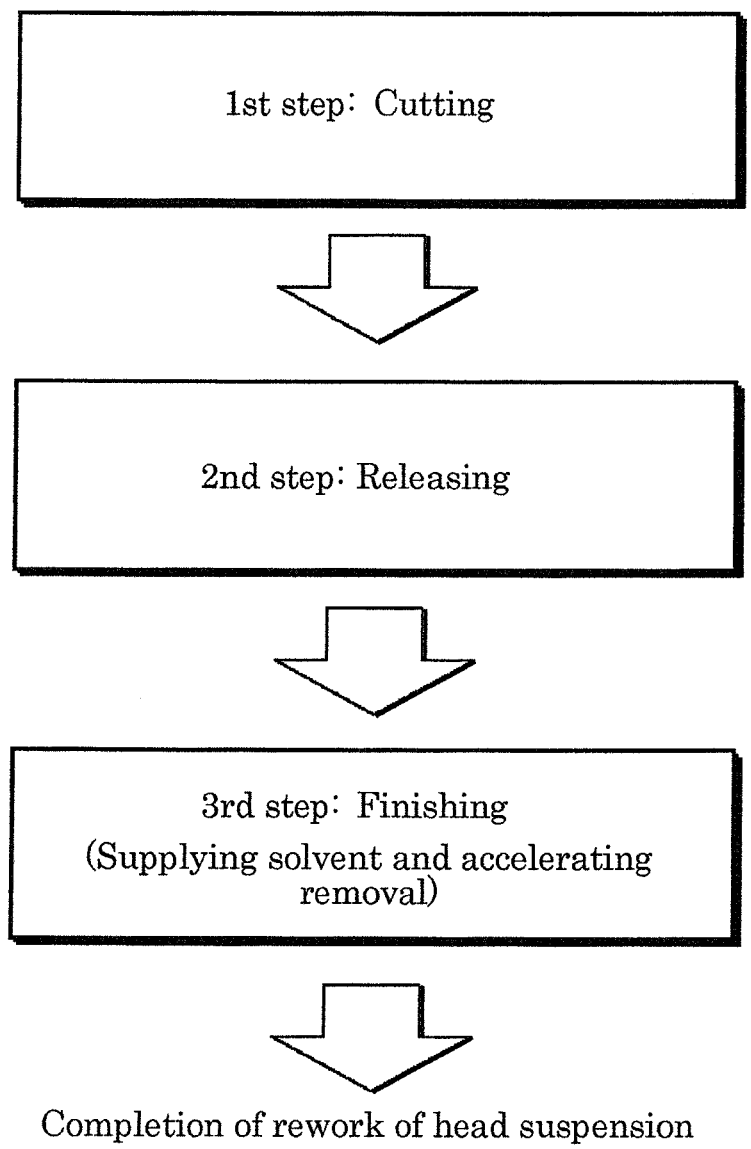
FIG. 7 is a flowchart illustrating a method of reworking a head suspension according to an embodiment of the present invention.

A method of reworking a head suspension according to an embodiment of the present invention will be explained with reference to FIGS. 7 to 10C in which FIG. 7 is a flowchart illustrating the method, FIGS. 8A to 8D illustrate a cutting step of the method carried out with the jig of FIGS. 5A and 5B, and FIGS. 9A to 9C and 10A to 10C illustrate a removing step of the method carried out with a heating tool.

The method illustrated in FIG. 7 removes the slider 25 from the head suspension 11 (head gimbal assembly) that includes the slider 25, flexure 19, wiring 31, and solder ball bonding parts 33a to 33f (solder ball bonding 33), so that the head suspension 11 is recycled.

In FIG. 7, removing the slider 25 from the head suspension 11 is carried out through a cutting step (first step), a releasing step (second step), and a finishing step (third step).

In the cutting step (first step), the blade 55 is pressed to the solder ball bonding 33 from the first side toward the second side in the longitudinal direction of the slider 25. At this time, the second side of the slider 25 is longitudinally stopped by the holding mechanism, and therefore, cutting force of the blade 55 is applied to and cuts the solder ball bonding 33 at once.

It is preferable that the holding mechanism loosely holds the slider 25 so that the slider 25 is slidable or movable for a predetermined distance in the longitudinal direction of the base 43.

The present invention applies no extra stress onto the head suspension 11 to be reworked during the reworking process. For this, the head suspension 11 is set to the jig 41 with required minimum force. The required minimum force means that the slider 25 is slidable or movable within the predetermined distance in the longitudinal direction of the base 43 after the head suspension 11 is set to the jig 41 as mentioned above.

More precisely, the slider 25 is movable within the range restricted by the stop face 51a and step 53a and is unable to move outside the range. The stop face 51a restricts the movement of the slider 25 backward in the direction of an arrow A of FIG. 6 and the step 53a restricts the same forward in the opposite direction of the arrow A.

If the slider 25 is allowed to unlimitedly move backward in the direction of the arrow A, the blade 55 is unable to cut the solder ball bonding 33. If the slider 25 is allowed to unlimitedly move forward in the opposite direction of the arrow A, the blade 55 will not be separated from the solder ball bonding 33 once the blade 55 bites the solder ball bonding 33.

The cutting step (first step) employs the cutting jig 41 and simultaneously cuts the solder ball bonding parts 33a to 33f at normal temperature without heating.

Operation of the cutting jig 41 according to the embodiment will be explained in detail with reference to FIGS. 6 and 8A to 8D.

In FIGS. 6 and 8A, the head suspension 11 (head gimbal assembly) is set on the cutting jig 41 such that the slider 25 is in contact with the step 53a of the guide groove 53. At this time, the blade carrier 45 is retracted to an initial position illustrated in FIGS. 6 and 8A.

A drive signal is applied to the driver 47 to slide the blade carrier 45 in the direction of the arrow A illustrated in FIG. 6.

Then, the cutting edge 55b at a front end of the blade 55 comes in contact with the solder ball bonding 33. As the blade carrier 45 continues the movement, the cutting edge 55b pushes the slider 25, so that the head gimbal assembly with the slider 25 is moved toward the upright end 51 and a rear side wall 25b of the slider 25 comes in contact with the stop face 51a of the upright end 51.

With the rear side wall 25b being pushed to the stop face 51a, the cutting edge 55b is driven into the solder ball bonding 33 as illustrated in FIG. 8B. The solder ball bonding 33 is then cut by the cutting edge 55b.

The cutting edge 55b of the blade 55 completely cuts the solder ball bonding 33 and hits a front side wall 25a of the slider 25 as illustrated in FIG. 8C.

In this way, the blade 55 is longitudinally driven from the first side of the slider 25 toward the solder ball bonding 33 in the longitudinal direction of the base 43, to simultaneously cut the solder ball bonding parts 33a to 33f (solder ball bonding 33).

Once the solder ball bonding 33 is cut, a control signal is given to the driver 47, so that the blade carrier 45 moves in the direction of an arrow illustrated in FIG. 8D.

At this time, there is a possibility that the cutting edge 55b of the blade 55 bites the solder ball bonding 33 and hardly separates therefrom. Even if this happens, the front wall 25a of the slider 25 is stopped by the step 53a during retraction of the blade carrier 45 and the slider 25 stops moving. Then, the cutting edge 55b separates from the solder ball bonding 33 and the blade carrier 45 returns to the initial position illustrated in FIGS. 6 and 8D.

At the completion of the cutting step of FIG. 7, the slider 25 is still attached to the tongue 21 at two locations. One is a solder layer 33a1 (FIG. 8D) that is remained due to a gap between the top face 55a of the blade 55 and the wiring 31 and is adhering to the front side wall 25a of the slider 25. The other is the adhesive 27 between the slider 25 and the tongue 21.

To detach the slider 25 from these two locations, the releasing step (second step) is carried out. The releasing step heats the slider 25 and applies the slider 25 with turning force in an in-plane direction parallel to the tongue 21. This breaks the solder layer 33a1 between the wiring 31 and the slider 25 and the adhesive 27 between the tongue 21 and the slider 25.

Applying the slider 25 with the turning force in the in-plane direction parallel to the tongue 21 is carried out by turning the slider 25 while keeping the head gimbal assembly immovable, or by turning to the head gimbal assembly while keeping the slider 25 immovable, or by turning both the head gimbal assembly and slider 25.

The releasing step (second step) will be explained in detail with reference to FIGS. 9A to 10C.

In FIG. 9A, the head suspension 11 (head gimbal assembly) that has finished the cutting step (first step) is set on a jig.

In FIG. 9B, a heating tool 71 is brought in contact with the slider 25.

FIG. 9C roughly illustrates the heating tool 71. The heating tool 71 is used to heat the slider 25 and apply the slider 25 with turning force in an in-plane direction parallel to the tongue 21. A front end of the heating tool 71 is provided with a fork 73 to hold the slider 25. A gap of the fork 73 is slightly wider than the width of the slider 25.

If the solder bonded to the slider 25 is lead-free solder, the temperature of the heating tool 71 is set to be about a melting temperature of the lead-free solder (in the range of about 240 to 270 degrees centigrade).

In FIG. 10A, the heating tool 71 holds the slider 25 with the fork 73, heats the slider 25, and applies torsional force to the slider 25 in the in-plane direction parallel to the tongue 21.

In FIG. 10B, the slider 25 is released as soon as the heating tool 71 is applied thereto.

Mechanism of the release of the slider 25 will be considered in a case that the adhesive 27 is an epoxy-resin-based adhesive, the tongue 21 is made of stainless steel, and the slider 25 is made of ceramics.

A thermal expansion coefficient of the epoxy-resin-based adhesive 27 is about three times as large as that of the stainless-steel tongue 21 and about eight times as large as that of the ceramic slider 25. In this way, the thermal expansion coefficients of the parts 21, 25, and 27 differ from one another. It is considered that such differences cause shearing force in an in-plane direction to weaken the bonding strength of the adhesive 27.

According to the embodiment, the ceramic slider 25 is fixed to the stainless-steel tongue 21 with the epoxy-resin-based adhesive 27. Namely, there are two interfaces among the different materials. The first interface is between the slider 25 and the adhesive 27 and the second interface is between the adhesive 27 and the tongue 21. The first interface involves the thermal expansion coefficient difference of about eight times and the second interface of about three times.

Based on the consideration that the thermal expansion coefficient differences cause shearing force in an in-plane direction to weaken the bonding strength of the adhesive 27, the first interface receives larger in-plane shearing force than the second interface, to greatly weaken the bonding strength of the adhesive 27. Due to this, the slider 25 is released from the adhesive 27 along the first interface.

In this way, it is considered that the releasing step (second step) releases the slider 25 based on the thermal expansion coefficient differences among the slider 25, adhesive 27, and tongue 21.

In FIG. 10C, the tongue 21 from which the slider 25 has been removed keeps a residual of the adhesive 27. The finishing step (third step) removes the adhesive 27 remaining on the tongue 21. Removing the adhesive 27 from the tongue 21 may be carried out through, for example, a solvent supply process and a removal acceleration process.

The solvent supply process supplies a solvent (for example, N-methylpyrrolidone (NMP) for the epoxy-resin-based adhesive) to the adhesive remaining part on the tongue 21.

The removal acceleration process heats the adhesive remaining part to apply physical energy thereto and accelerate the removal of the adhesive 27 therefrom.

The finishing step (third step) involving these processes easily removes the adhesive 27 without directly applying force to the tongue 21. This prevents the head suspension 11 from being damaged, deformed, or changed in load, shortens a reworking time, and improves product yield.

In this way, the head suspension reworking method according to the embodiment removes the slider 25 from the head suspension 11 by longitudinally pressing the blade 55 from the first side of the slider 25 toward the solder ball bonding 33 and stopping the second side of the slider 25 in the longitudinal direction with the holding mechanism, so that the blade 55 is forced to bite and cut the solder ball bonding 33.

According to the embodiment, the rear side wall 25b of the slider 25 is pushed to the stop face 51a of the upright end 51, and under this state, the blade 55 simultaneously cuts the solder ball bonding parts 33a to 33f (solder ball bonding 33).

Components of the head suspension other than the slider 25 receive no extra force when the solder ball bonding 33 is cut. Namely, the components of the head suspension except the slider 25 are put in a stress-free state when the solder ball bonding 33 is cut. This prevents the reworked head suspension from deforming, thereby improving product yield.

The head suspension reworked according to the embodiment substantially has no remnant of solder. Even if solder remains on the head suspension, it is flat. Accordingly, a new slider can easily be arranged on the head suspension through normal manufacturing processes, to provide a refurbished head suspension.

According to the embodiment, the holding mechanism loosely holds the slider 25 so that the slider 25 is slidable or movable for a predetermined distance in the longitudinal direction of the body 49 of the holding mechanism. The step 53a restricts the movement of the slider 25 forward in the opposite direction of the arrow A of FIG. 6 so that, even if the blade 55 bites the solder ball bonding 33, the blade 55 is easily separated from the solder ball bonding 33.

According to the embodiment, the rear side wall 25b of the slider 25 is pushed to the stop face 51a of the upright end 51, and under this state, the blade 55 cuts the solder ball bonding 33 as the bonding material. Accordingly, even if the solder ball bonding 33 is hard, it can easily be cut. Namely, the embodiment is appropriate for cutting the solder ball bonding 33 of the head suspension.

The cutting step (first step) according to the embodiment is carried out at normal temperature. Compared with carrying out the cutting step at increased temperature, carrying out the same at normal temperature prevents molten solder from scattering, thereby preventing contamination.

According to the embodiment, the releasing step (second step) after the cutting step (first step) heats the slider 25 and applies the slider 25 with turning force in an in-plane direction parallel to the tongue 21, thereby releasing the adhesive 27 between the tongue 21 and the slider 25. At this time, the heat influences only the slider 25 and a limited area around the same, and therefore, most part of the head suspension is free from the influence of the heat.

According to the embodiment, the turning force applied to the slider 25 acts on the tongue 21 only in an in-plane direction. Namely, no deformation mode occurs to separate the tongue 21 from the dimple (not illustrated) of the flexure 19.

According to the embodiment, the releasing step (second step) releases the slider 25 by using thermal expansion coefficient differences among the slider 25, adhesive 27, and tongue 21. Namely, the thermal expansion coefficient differences produce shearing force in an in-plane direction to weaken the bonding strength of the adhesive 27 and release the slider 25 from the tongue 21.

According to the embodiment, the heating tool 71 having the fork 73 to hold the slider 25 is used in the releasing step (second step), to heat the slider 25 and apply turning force thereto in an in-plane direction parallel to the tongue 21. It therefore can speedily detach the slider 25 from the tongue 21 without contaminating the periphery of the tongue 21 with molten solder.

When the solder ball bonding 33 is made of lead-free solder, the embodiment heats the heating tool 71 to a melting temperature of the lead-free solder. Even if the solder layer 33a1 (FIG. 8D) remains after the cutting step (first step), the heat of the heating tool 71 will instantaneously melt the solder layer 33a1. Accordingly, this prevents the remaining solder layer 31a from deteriorating the rework of the head suspension 11.

The embodiment employs the cutting jig 41 to cut the solder ball bonding 33 in order to release the slider 25 of the head suspension 11. The jig 41 includes the cutting mechanism to longitudinally press the blade 55 to the solder ball bonding 33 from the first side of the slider 25. The cutting jig 41 also includes the holding mechanism that longitudinally catches the second side of the slider 25 when the blade 55 is pressed to the solder ball bonding 33, thereby forcing the blade 55 to bite and cut the solder ball bonding 33.

With the cutting jig 41, the rear side wall 25b of the slider 25 is brought into contact with the stop face 51a of the upright end 51, and in this state, the blade 55 simultaneously cuts the solder ball bonding parts 33a to 33f. At this time, no excess force that may deform the head suspension 11 is applied to the head suspension 11. Namely, the solder ball bonding 33 is cut with components of the head suspension 11 except the slider 25 being in a stress-free state. The embodiment, therefore, prevents the deformation of the head suspension 11 during the reworking of the head suspension 11 and improves product yield.

According to the embodiment, the holding mechanism loosely holds the slider 25 so that the slider 25 is movable for a predetermined distance in the longitudinal direction of the base 43 of the holding mechanism. The step 53a restricts the movement of the slider 25 in the opposite direction of the arrow A of FIG. 6 so that, even if the blade 55 bites the solder ball bonding 33, the blade 55 is easily separated from the solder ball bonding 33.

Although the present invention has been explained by reference to certain embodiments, the present invention is not limited to the embodiments. Modifications and variations of the embodiments will occur to those skilled in the art in light of the teachings of this specification. Accordingly, head suspension reworking methods and cutting jigs for rework derived from such modifications and variations also fall in the scope of the present invention.

For example, the driver 47 that is a motor according to the embodiment is replaceable with any other drive unit such as a manual drive unit. The solder ball bonding 33 of the embodiment is replaceable with gold ball bonding (GBB).

The method of the present invention may be carried out other cutting jigs such that a cutting mechanism and a holding mechanism that may be separately supported.

What is claimed is:

1. A method of reworking a head suspension that includes a magnetic head, a slider on which the magnetic head is arranged having a first side and a second side in a longitudinal direction thereof, a flexure having a tongue resiliently supporting the slider, wiring formed on the flexure, and a terminal joint where an electric terminal of the slider and an electric terminal of the wiring are joined together with a bonding material, the method comprising steps of:
    loosely holding the slider by a holder mechanism so that the slider is forwardly and backwardly movable for a predetermined distance in the longitudinal direction of the slider while components of the head suspension except the slider are put in a stress-free state;
    pressing a blade to the bonding material from the first side toward the second side in the longitudinal direction of the slider to move the slider on the holding mechanism in the longitudinal direction; and
    bringing the second side of the moving slider into contact with a stop face of the holding mechanism in the longitudinal direction to stop the slider moving on the holding mechanism in the longitudinal direction, thereby forcing the blade to bite and cut the bonding material to remove the slider from the flexure.

2. The method of claim 1, wherein the bonding material is solder.

3. The method of claim 1, wherein the bonding material is cut at normal temperature.

4. The method of claim 1, wherein the slider is fixed to the tongue with an adhesive, and
    the method further comprises, after cutting the bonding material, heating the slider, applying a turning force to the slider in an in-plane direction parallel to the tongue, and releasing the slider and the tongue from fixation with the adhesive.

5. The method of claim 4, wherein the bonding material is lead-free solder, and heating the slider heats the slider to a melting temperature of the lead-free solder approximately.

6. The method of claim 4, wherein releasing the slider and the tongue from fixation with the adhesive is achieved by utilizing thermal expansion coefficient differences among the slider, adhesive, and tongue.

7. The method of claim 4, wherein heating the slider and applying the turning force to the slider in the in-plane direction parallel to the tongue are carried out with the use of a heating tool, and the heating tool has a fork to hold the slider.

8. The method of claim 1, wherein a movable range of the slider in the longitudinal direction on the holding mechanism is restricted to the predetermined distance by the stop face and a step.

9. A method of reworking a head suspension that includes a magnetic head, a slider on which the magnetic head is arranged having a first side and a second side in a longitudinal direction thereof, a flexure having a tongue resiliently supporting the slider, wiring formed on the flexure, and a terminal joint where an electric terminal of the slider and an electric terminal of the wiring are joined together with a bonding material, the method comprising steps of:
    holding the slider by a holder mechanism in a manner that allows the slider to move forward and backward for a predetermined distance in the longitudinal direction of the slider while components of the head suspension except the slider are in a stress-free state;
    pressing a blade to the bonding material at a first side of the slider in a direction from the first side toward the second side in the longitudinal direction of the slider, thereby moving the slider on the holding mechanism in the longitudinal direction;
    bringing the second side of the slider, which is moving in response to the blade pressing, into contact with a stop face of the holding mechanism and thereby stopping the slider movement in said longitudinal direction;
    the blade pressing continuing after the second face is brought into contact with the stop face forcing the blade to bite into and cut through the bonding material to the first face of the slider; and
    ceasing the blade pressing when the blade has cut through the bonding material to said first face.

* * * * *